(12) United States Patent
Wu

(10) Patent No.: US 9,077,378 B2
(45) Date of Patent: Jul. 7, 2015

(54) INTEGRATED-INTERLEAVED LOW DENSITY PARITY CHECK (LDPC) CODES

(71) Applicant: LSI Corporation, San Jose, CA (US)

(72) Inventor: YingQuan Wu, Palo Alto, CA (US)

(*) Notice: Subject to any disclaimer, the term of this patent is extended or adjusted under 35 U.S.C. 154(b) by 100 days.

(21) Appl. No.: 13/755,757

(22) Filed: Jan. 31, 2013

(65) Prior Publication Data

US 2014/0215285 A1   Jul. 31, 2014

(51) Int. Cl.
| | | |
|---|---|---|
| *H03M 13/00* | (2006.01) | |
| *H03M 13/11* | (2006.01) | |
| *H03M 13/13* | (2006.01) | |
| *H03M 13/27* | (2006.01) | |
| *H03M 13/25* | (2006.01) | |
| *H03M 13/15* | (2006.01) | |
| *H03M 13/29* | (2006.01) | |

(52) U.S. Cl.
CPC .......... *H03M 13/1128* (2013.01); *H03M 13/13* (2013.01); *H03M 13/2707* (2013.01); *H03M 13/255* (2013.01); *H03M 13/152* (2013.01); *H03M 13/1102* (2013.01); *H03M 13/1117* (2013.01); *H03M 13/2942* (2013.01)

(58) Field of Classification Search
CPC ...................................... H03M 13/13
USPC ......................... 714/752, 755, 758
See application file for complete search history.

(56) References Cited

U.S. PATENT DOCUMENTS

| | | | |
|---|---|---|---|
| 5,946,328 A | | 8/1999 | Cox et al. |
| 6,275,965 B1 * | | 8/2001 | Cox et al. ...................... 714/755 |
| 6,903,887 B2 | | 6/2005 | Asano et al. |
| 7,231,578 B2 * | | 6/2007 | Hassner et al. ............... 714/762 |
| 7,334,181 B2 * | | 2/2008 | Eroz et al. ..................... 714/801 |
| 7,584,401 B2 * | | 9/2009 | Hong et al. .................... 714/755 |
| 7,971,130 B2 * | | 6/2011 | Ramamoorthy .............. 714/785 |
| 8,044,832 B1 * | | 10/2011 | Zhang et al. .................... 341/81 |
| 8,161,360 B1 | | 4/2012 | Wu |
| 8,179,955 B2 * | | 5/2012 | Taylor et al. .................. 375/230 |
| 8,351,541 B2 * | | 1/2013 | Taylor et al. .................. 375/295 |
| 8,516,333 B1 * | | 8/2013 | Dave et al. ..................... 714/755 |

OTHER PUBLICATIONS

Abdel-Ghaffar et al., "Multilevel Error-Control Codes for Data Storage Channel," IEEE Trans. Inform. Theory, vol. 37, No. 3, pp. 735-741 (May 1991).

E.R. Berlekamp, "Alegbraic Coding Theory," McGraw-Hill, New York, 1968.

(Continued)

*Primary Examiner* — Esaw Abraham
(74) *Attorney, Agent, or Firm* — Ryan, Mason & Lewis, LLP

(57) ABSTRACT

Methods and apparatus are provided for integrated-interleaved Low Density Parity Check (LDPC) coding and decoding. Integrated-interleaved LDPC encoding is performed by obtaining at least a first data element and a second data element; systematically encoding the at least first data element using a submatrix $H_0$ of a sparse parity check matrix $H_1$ to obtain at least a first codeword; truncating the at least first data element to obtain at least a first truncated data element; systematically encoding the at least second data element and the at least first truncated data element using the sparse parity check matrix $H_1$ to obtain a nested codeword; and generating a second codeword based at least in part on a combination of the first codeword and the nested codeword. Integrated-interleaved LDPC decoding is also provided.

20 Claims, 3 Drawing Sheets

(56) References Cited

OTHER PUBLICATIONS

Blokh at al., "Coding of Generalized Concatenated Codes," Problems of Information Transmission, vol. 10, pp. 45-50 (1974).
Hassner et al., "Integrated Interleaving—a novel ECC Architecture," IEEE Trans. Magnetics, vol. 37, pp. 773-775 (Mar. 2001).
A. Patel, "Two-Level Coding for Error-Control in Magnetic Disk Storage Products," IBM J. Res. Develop., vol. 33, pp. 470-484 (1989).
Tang et al., "On the Performance of Integrated Interleaving Coding Schemes," Proc. IEEE Int. Symp. Inform. Theory, pp. 328, Chicago, IL, USA (2004).

* cited by examiner

100

200

INTEGRATED-INTERLEAVED LOW DENSITY PARITY CHECK (LDPC) CODES

FIELD

The present invention relates generally to error correcting codes, and more particularly, to integrated-interleaved encoding and decoding techniques.

BACKGROUND

Error correcting codes allow data errors to he detected and corrected, provided the number of errors or the characteristics of the errors fall within the correction capabilities of the code that is used. Integrated-interleaved codes, for example, are systematic codes (i.e., the input data is included or otherwise embedded in the encoded data) that generate multiple codewords, each of which is associated with a particular level. The integrated-interleaved coding scheme can he used to compensate for format inefficiencies due to small block lengths and he deployed in distributed storage systems.

SUMMARY

Generally, methods and apparatus are provided for integrated-interleaved Low Density Parity Check (LDPC) coding and decoding. According to one aspect of the invention, integrated-interleaved LDPC encoding is performed by obtaining at least a first data element and a second data element; systematically encoding the at least first data element using a submatrix $H_0$ of a sparse parity check matrix $H_1$ to obtain at least a first codeword; truncating the at least first data element to obtain at least a first truncated data element; systematically encoding the at least second data element and the at least first truncated data element using the sparse parity check matrix $H_1$ to obtain a nested codeword; and generating a second codeword based at least in part on a combination of the first codeword and the nested codeword.

A more complete understanding of the present invention, as well as further features and advantages of the present invention, will be obtained by reference to the following detailed description and drawings.

DETAILED DESCRIPTION

Figure 1:
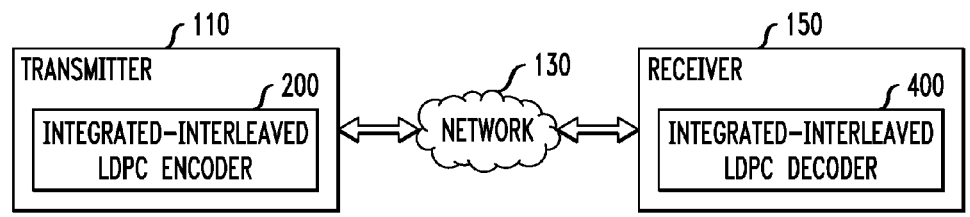
FIG. 1 illustrates an exemplary communication system in which aspects of the present invention can be employed.

Various aspects of the invention are directed to integrated-interleaved LDPC encoding and decoding techniques. A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Integrated-Interleaved Coding Scheme

The integrated-interleaved coding scheme nests a set of m component codewords with v (v<m) more powerful (e.g., second or higher level) codewords in the nested layer which is a subcode of the component layer. Thus, v can be considered a number of second level codewords. The nested layer enables the correction of up to v component words that fail by self-decoding. For a more detailed discussion of the integrated-interleaved coding scheme, see, for example, U.S. Pat. No. 5,946,328, entitled "Method and Means for Efficient Error Detection and Correction in Long Byte Strings Using Integrated Codewords;" M. A. Hassner et al., "Integrated Interleaving—a Novel ECC Architecture," IEEE Trans. Magnetics, vol. 37, 773-775 (March 2001); and/or U.S. Pat. No. 8,161,360, entitled "Integrated Interleaved Codes," each incorporated by reference herein.

Under an exemplary two-level integrated-interleaved coding scheme, let $\{C_i\}_{i=0}^1$ be (n, $k_i$, $d_i$) over the Galois field GF(q) such that $C_1 \subset C_0$ and $d_1 > d_0$, where $C_i$, i=0, 1, explicitly assume cyclic components codes, such as Reed-Solomon codes (possibly shortened). Denote by $\alpha$ a primitive element of GF(q). An integrated-interleaved code is defined as follows $$C \triangleq \left\{ c = [c_0, c_1, c_2, \ldots, c_{m-1}] : c_i \in C_0, \sum_{i=0}^{m-1} \alpha^{bi} c_i \in C_1, b = 0, 1, 2, \ldots, v-1 \right\}, \quad (1)$$

where v<m<q.

Integrated-Interleaved LDPC Coding Scheme

According to one aspect of the present invention, the above integrated-interleaved code description is extended to LDPC codes with respect to v=1. Let $H_1$ be a sparse parity check matrix of $C_1(n, k_1)$ LDPC code and $H_0$ be a submatrix of $H_1$ corresponding to $C_0(n, k_0)$ LDPC code. An exemplary integrated-interleaved LDPC code can be defined as follows:

$$C \triangleq \left\{ c = [c_0, c_1, c_2, \ldots, c_{m-1}] : H_0 c_i^T = 0, H_1 \left( \sum_{i=0}^{m-1} c_i \right)^T = 0 \right\} \quad (2)$$

FIG. 1 illustrates an exemplary communication system 100 in which aspects of the present invention can be employed. As shown in FIG. 1, a transmitter 110 includes an integrated-interleaved LDPC encoder 200, as discussed further below in conjunction with FIGS. 2 and 3. Data is encoded using an integrated-interleaved LDPC code and any additional processing is applied as needed or appropriate. The processed data is then transmitted over a communication network 130. The communication network 130 may be embodied, for example, as any combination of wired and/or wireless communication devices. A receiver 150 receives a signal from the network 130 and processes the signal, including decoding the signal using an integrated-interleaved LDPC decoder 400, as discussed further below in conjunction with FIG. 4. Typically, a communication network 130 is noisy and the signal received by the receiver 150 is typically corrupted by noise.

In one or more exemplary embodiments, an integrated-interleaved LDPC code is used to compensate for format inefficiencies (e.g., due to a short block length and/or to reduce hardware costs in designing codes of a relatively long block length). In further embodiments, an integrated-interleaved LDPC code is used in another application besides the exemplary example shown in FIG. 1.

Aspects of the present invention provide a particular mapping or coding associated with integrated-interleaved LDPC coding. In one or more exemplary embodiments, a second level has a single component codeword and in other embodiments the second level has two or more codewords.

Figure 2:
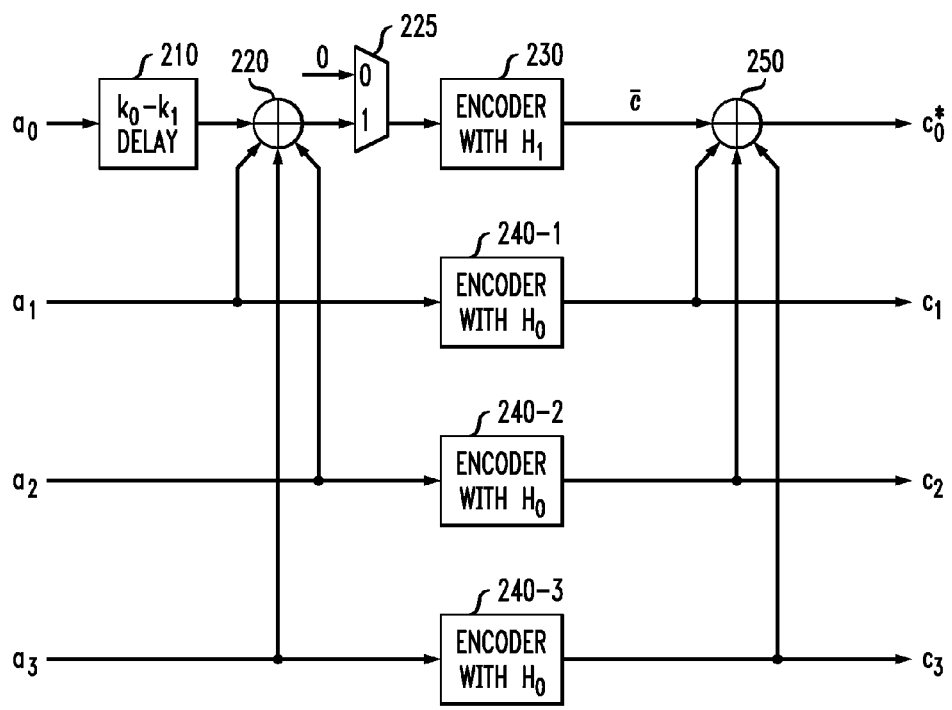
FIG. 2 is a block diagram of an exemplary two-level integrated-interleaved Low Density Parity Check (LDPC) encoder incorporating aspects of the present invention.

FIG. 2 is a block diagram of an exemplary two-level integrated-interleaved LDPC encoder 200 incorporating aspects of the present invention, for the case where m=4 and v=1. Generally, the exemplary integrated-interleaved LDPC encoder 200 of FIG. 2 aligns input messages $a_0, a_1, a_2, a_3$, and then linearly combines the input messages $a_0, a_1, a_2, a_3$, for the nested-layer encoding. As discussed hereinafter, the first step systematically encodes the messages $a_1, a_2, \ldots, a_{m-1}$, with respect to $H^0$, and consequently yields component codewords $c_1, c_2, \ldots, c_{m-1}$, respectively.

Thus, as shown in FIG. 2, the exemplary integrated-interleaved LDPC encoder 200 comprises systematic encoders 240-1 through 240-3 that are configured to receive and encode input data $a_1, a_2, a_3$, respectively, using submatrix $H_0$, as defined by Eq. (2). First-level codewords $c_1, c_2, c_3$, are generated by systematic encoders 240-1 through 240-3, respectively.

To obtain the exemplary second-level codeword $c_0^*$, truncated input, data $a_1, a_2, a_3$, is added to a delayed version of input data $a_0$ generated using delay element 210. Denote by $a'_i$ the truncated message of $a_i$, $a'_i = [a_{i,0}, a_{i,1}, \ldots, a_{i,k_1-1}]$. The original input messages $a_0, a_1, a_2, a_3$ have a length $k_0$ and the truncated messages $a'_1, a'_2, a'_3$ have a length $k_1$ ($k_0 > k_1$).

As shown in FIG. 2, the left-aligned summation $a_0 + \Sigma_{i=1}^{m-1} a'_i$ (using delay element 210 for alignment and adder 220 for summation) is selected by multiplexer 225 and systematically encoded at stage 230 with respect to $H_1$ to yield a nested codeword $\bar{c}$.

As shown in FIG. 2, adder 250 is configured to receive the first-level codewords $c_1, c_2, c_3$, as well as the nested codeword $\bar{c}$ to perform the following operation to generate the exemplary second-level codeword $c_0^*$:

$$c_0^* \stackrel{\Delta}{=} \bar{c} - \sum_{i=1}^{m-1} c_i. \quad (3)$$

In the exemplary embodiment of FIG. 2, where v is equal to 1, the second level has a single component codeword. In cases where v is greater than 1, the second level has a plurality of component codewords.

It can be verified that $c_0^* \in C_0$, and furthermore, $c_0^* + \Sigma_{i=1}^{m-1} c_i = c \in C_1$.

Figure 3:
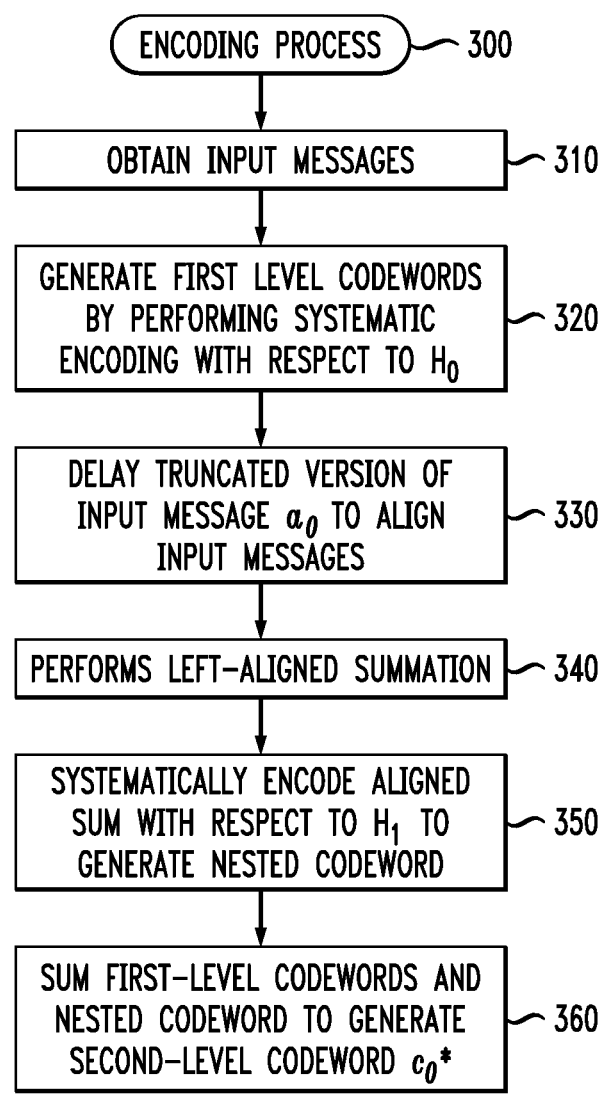
FIG. 3 is a flowchart illustrating an embodiment of an exemplary encoding process for two-level integrated-interleaved LDPC encoding.

FIG. 3 is a flowchart illustrating an embodiment of an exemplary encoding process 300 for two level integrated-interleaved LDPC encoding, where m=4 and v=1. As shown in FIG. 3, the exemplary encoding process 300 initially obtains input messages $a_0, a_1, a_2, a_3$ during step 310. Thereafter, first level codewords $c_1, c_2, c_3$ are generated during step 320 by performing systematic encoding with respect to $H_0$.

The truncated version of input message $a_0$ is then delayed during step 330 using delay element 210 to align the truncated input message $a_0$ with input messages $a_1, a_2, a_3$. Adder 220 then performs a left-aligned summation $a_0 + \Sigma_{i=1}^{m-1} a'_i$ during step 340. The sum generated by adder 220 is then systematically encoded with respect to $H_1$ during step 350 to generate a nested codeword $\bar{c}$.

Finally, adder 250 receives the first-level codewords $c_1, c_2, c_3$, as well as the nested codeword $\bar{c}$ during step 360 to generate the exemplary second-level codeword $c_0^*$, as follows:

$$c_0^* \stackrel{\Delta}{=} \bar{c} - \sum_{i=1}^{m-1} c_i.$$

Integrated-Interleaved LDPC Decoding Scheme

Figure 4:
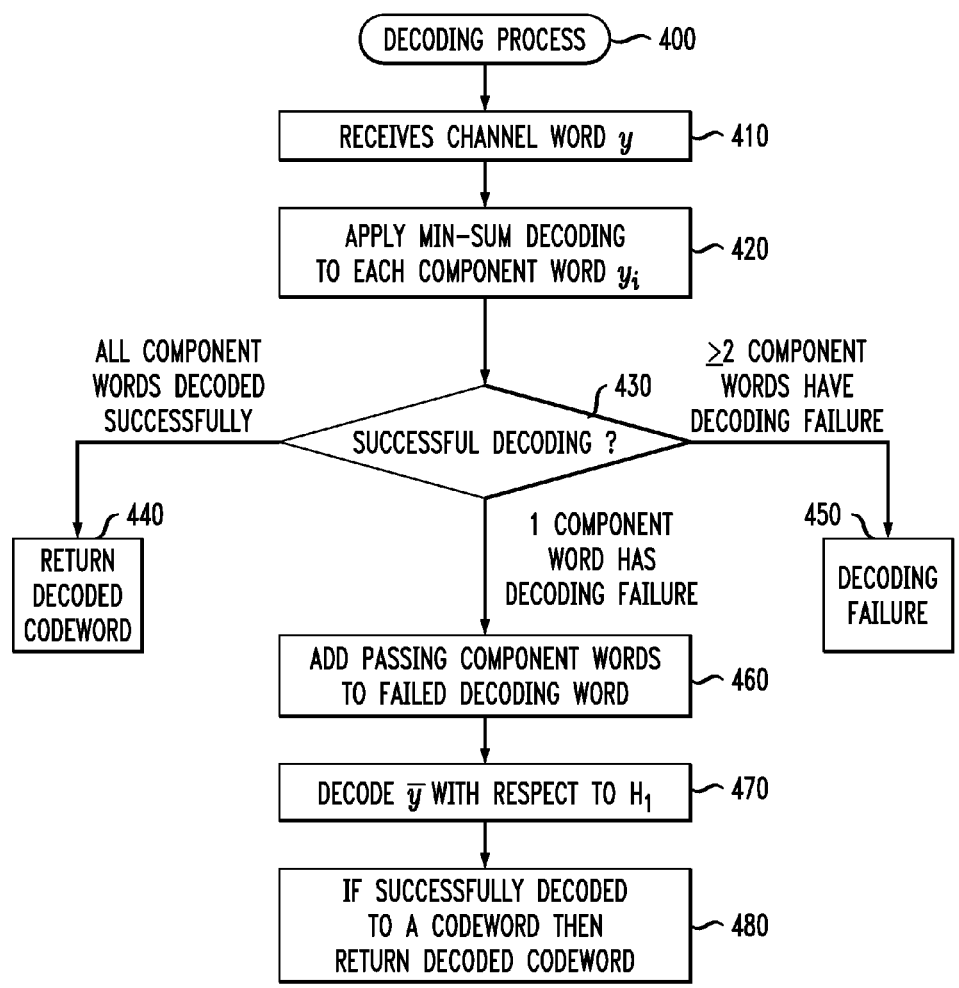
FIG. 4 is a flowchart illustrating an embodiment of an exemplary decoding process for two-level integrated-interleaved LDPC decoding.

FIG. 4 is a flowchart illustrating an embodiment of an exemplary decoding process 400 for two level integrated-interleaved LDPC decoding, where m=4 and v=1. As shown in FIG. 4, the exemplary decoding process 400 initially receives a channel word $y=[y_0, y_1, \ldots, y_{m-1}]$ during step 410. The exemplary decoding process 400 applies a min-sum decoding to each component word $y_i$, i=0, 1, ..., m−1 during step 420. If it is determined during step 430 that each component word is decoded successfully, then the corrected codeword is returned during step 440. If it is determined during step 430 that two or more component words incur decoding failure, then a decoding failure is declared during step 450. If it is determined during step 430 that one component word incurs a decoding failure, say, $y_j$, then all other passing decoded codewords are added to the failed codeword during step 460, such that $y=y_j+\Sigma_{i \neq j} c_i$ and then y is decoded with respect to $H_1$ during step 470. If successfully decoding to a codeword c, then declare $c_j=c-\Sigma_{i \neq j} c_i$ during step 480.

While aspects of the present invention have been illustrated using integrated-interleaved LDPC encoding and decoding for v equal to 1, the present invention can be extended to additional values of v, as would be apparent to a person of ordinary skill in the art. In addition, while aspects of the present invention have been illustrated using two-level integrated-interleaved LDPC encoding and decoding, the present invention can be extended to higher-level integrated-interleaved LDPC encoding and decoding, as would be apparent to a person of ordinary skill in the art.

Process, System and Article of Manufacture Details

While a number of flow charts herein describe an exemplary sequence of steps, it is also an embodiment of the present invention that the sequence may be varied. Various permutations of the algorithm are contemplated as alternate embodiments of the invention. While exemplary embodiments of the present invention have been described with respect to processing steps in a software program, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium. may be a tangible recordable medium (e.g., floppy disks, hard drives, compact disks, memory cards, semiconductor devices, chips, application specific integrated circuits (ASICs)) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The computer systems and servers described herein may each contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network.

It is to be understood that the embodiments and variations shown and described herein are merely illustrative of the principles of this invention and that various modifications may be implemented by those skilled in the art without departing from the scope and spirit of the invention.

I claim:

1. A method for performing integrated-interleaved Low Density Parity Check (LDPC) encoding, comprising:
  obtaining at least a first data element and at least a second data element;
  systematically encoding the at least first data element using a submatrix $H_0$ of a sparse parity check matrix $H_1$ to obtain at least a first codeword;
  truncating the at least first data element to obtain at least a first truncated data element;
  systematically encoding the at least second data element and the at least first truncated data element using said sparse parity check matrix H1 to obtain a nested codeword; and
  generating a second codeword based at least in part on a combination of the first codeword and the nested codeword.

2. The method of claim 1, further comprising the step of outputting the first codeword and the second codeword.

3. The method of claim 1, further comprising the step of delaying the at least second data element to align the at least second data element with the at least first truncated data element.

4. The method of claim 3, wherein the at least first data element and the at least second data element each have a length of $k_0$ and wherein the at least first truncated data element has a length of $k_1$ and wherein the step of delaying the at least second data element to align the at least second data element with the at least first truncated data element comprises a delay of $k_0-k_1$.

5. The method of claim 1, wherein the combination of the first and nested codewords comprises an addition of the first and nested codewords.

6. The method of claim 1, wherein the at least first. data element comprises a first level and wherein the at least second data element comprises a second level.

7. The method of claim 6, wherein the second data element is the only codeword associated with the second level.

8. A non-transitory computer machine-readable recordable storage medium for performing integrated-interleaved Low Density Parity Check (LDPC) encoding, wherein one or more software programs when executed by one or more processing devices implement the steps of the method of claim 1.

9. An integrated-interleaved Low Density Parity Check (LDPC) encoding system, comprising:
  an input for obtaining at least a first data element and at least a second data element; and
  an encoder configured to:
    systematically encode the at least first data element using a submatrix $H_0$ of a sparse parity check matrix $H_1$ to obtain at least a first codeword;
    truncate the at least first data element to obtain at least a first truncated data element;
    systematically encode the at least second data element and the at least first truncated data element using said sparse parity check matrix H 1 to obtain a nested codeword; and
    generate a second codeword based at least in part on a combination of the first codeword and the nested codeword.

10. The integrated-interleaved LDPC encoding system of claim 9, wherein said encoder is further configured to output the first codeword and the second codeword.

11. The integrated-interleaved LDPC encoding system of claim 9, wherein said encoder is further configured to delay the at least second data element to align the at least second data element with the at least first truncated data element.

12. The integrated-interleaved LDPC encoding system of claim 11, wherein the at least first data element and the at least second data element each have a length of $k_0$ and wherein the at least first truncated data element has a length of $k_1$ and wherein the step of delaying the at least second data element to align the at least second data element with the at least first truncated data element comprises a delay of $k_0-k_1$.

13. The integrated-interleaved LDPC encoding system of claim 9, wherein the combination of the first and nested codewords comprises an addition of the first and nested codewords.

14. The integrated-interleaved LDPC encoding system of claim 9, wherein the at least first data element comprises a first level and wherein the at least second data element comprises a second level.

15. The integrated-interleaved LDPC encoding system of claim 14, wherein the second data element is the only codeword associated with the second level.

16. The integrated-interleaved LDPC encoding system of claim 9, wherein the encoder is implemented as a hardware circuit.

17. The integrated-interleaved LDPC encoding system of claim 9, wherein the system is implemented within an integrated circuit.

18. An integrated-interleaved Low Density Parity Check (LDPC) encoder, wherein the encoder is configured to:

systematically encode at least a first data element using a submatrix $H_0$ of a sparse parity check matrix $H_1$ to obtain at least a first codeword;

truncate the at least first data element to obtain at least a first truncated data element;

systematically encode at least a second data element and the at least first truncated data element using said sparse parity check matrix $H_1$ to obtain a nested codeword; and generate a second codeword based at least in part on a combination of the first codeword and the nested codeword.

19. The integrated-interleaved LDPC encoder of claim 18, wherein said encoder is further configured to output the first codeword and the second codeword.

20. The integrated-interleaved LDPC encoder of claim 18, wherein said encoder is further configured to delay the at least second data element to align the at least second data element with the at least first truncated data element.

* * * * *

UNITED STATES PATENT AND TRADEMARK OFFICE
CERTIFICATE OF CORRECTION

PATENT NO. : 9,077,378 B2  
APPLICATION NO. : 13/755757  
DATED : July 7, 2015  
INVENTOR(S) : YingQuan Wu It is certified that error appears in the above-identified patent and that said Letters Patent is hereby corrected as shown below:

Title page

In Applicant & Assignee Sections, replace "LSI Corporation, San Jose, CA," with --Seagate Technology LLC, Cupertino, CA--.

Specification

Column 1, lines 12, 19 and 21, replace "he" with --be--.

Column 3, line 27, replace "$H^{0}$" with --$H_0$--.

Column 3, line 37, replace "input, data" with --input data--.

Column 3, line 39, replace "$a'_i = [a_{i,0}, a_{i,1}, \ldots, a_{i,k_1}^{-1}]$." with --$a'_i = [a_{i,0}, a_{i,1}, \ldots, a_{i,k_1-1}]$--.

Column 5, line 24, replace "medium. may be" with --medium may be--.

Claims

Column 6, In Claim 1, line 3, replace "H1" with --$H_1$--.

Column 6, In Claim 6, line 25, replace "first. data" with --first data--.

Column 6, In Claim 9, line 48, replace "H1" with --$H_1$--.

Column 8, In Claim 18, line 8, replace "H1" with --$H_1$--.

Signed and Sealed this  
Twelfth Day of April, 2016

Michelle K. Lee  
*Director of the United States Patent and Trademark Office*